(12) United States Patent
McGrath et al.

(10) Patent No.: US 11,196,423 B1
(45) Date of Patent: *Dec. 7, 2021

(54) PROGRAMMABLE DEVICE HAVING HARDENED CIRCUITS FOR PREDETERMINED DIGITAL SIGNAL PROCESSING FUNCTIONALITY

(71) Applicant: XILINX, INC., San Jose, CA (US)

(72) Inventors: John McGrath, Tipperary (IE); Woon Wong, Dublin, CA (US); John O'Dwyer, Kildare (IE); Paul Newson, Yvelines (FR); Brendan Farley, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/911,361

(22) Filed: Jun. 24, 2020

Related U.S. Application Data

(63) Continuation of application No. 16/682,818, filed on Nov. 13, 2019, now Pat. No. 10,720,926.

(51) Int. Cl.
*H03K 19/1776* (2020.01)

(52) U.S. Cl.
CPC ................ *H03K 19/1776* (2013.01)

(58) Field of Classification Search
None
See application file for complete search history.

(56) References Cited

U.S. PATENT DOCUMENTS

| | | | |
|---|---|---|---|
| 7,084,664 B1 * | 8/2006 | Lee ................ | H03K 19/17732 326/38 |
| 7,346,644 B1 * | 3/2008 | Langhammer ... | H03K 19/17732 326/38 |
| 7,602,212 B1 * | 10/2009 | Chan ............... | H03K 19/17732 326/37 |
| 10,476,514 B1 | 11/2019 | Vaz et al. | |
| 2015/0311899 A1 * | 10/2015 | Karras ............ | H03K 19/17724 326/41 |
| 2019/0096813 A1 | 3/2019 | Lesea et al. | |

* cited by examiner

*Primary Examiner* — Jany Richardson
(74) *Attorney, Agent, or Firm* — Patterson + Sheridan, LLP

(57) ABSTRACT

An example programmable device includes a configuration memory configured to store configuration data; a programmable logic having a configurable functionality based on the configuration data in the configuration memory; a signal conversion circuit; a digital processing circuit; an endpoint circuit coupled to the signal conversion circuit through the digital processing circuit; wherein the digital processing circuit includes a first one or more digital processing functions implemented as hardened circuits each having a predetermined functionality, and a second one or more processing functions implemented by the configurable functionality of the programmable logic.

20 Claims, 9 Drawing Sheets

PROGRAMMABLE DEVICE HAVING HARDENED CIRCUITS FOR PREDETERMINED DIGITAL SIGNAL PROCESSING FUNCTIONALITY

CROSS-REFERENCE TO RELATED APPLICATIONS

This application is a continuation of U.S. non-provisional patent application Ser. No. 16/682,818, filed Nov. 13, 2019, "Programmable Device Having Hardened Circuits For Predetermined Digital Signal Processing Functionality", which is herein incorporated by reference in their entirety.

TECHNICAL FIELD

Examples of the present disclosure generally relate to programmable devices and, in particular, to programmable devices having hardened circuits for predetermined digital signal processing functionality.

BACKGROUND

Integrated circuits (ICs) may be implemented to perform specified functions. One type of IC is a programmable IC, such as a field programmable gate array (FPGA) or a system-on-chip (SoC) including an FPGA-based programmable fabric. An FPGA fabric typically includes an array of programmable tiles, These programmable tiles may include, for example, input/output blocks (IOBs), configurable logic blocks (CLBs), dedicated random access memory blocks (BRAM), multipliers, digital signal processing blocks (DSPs), processors, dock managers, delay lock loops (DLLs), and so forth.

Each programmable the typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Some applications for programmable ICs include frequently performed functions. It is desirable to provide hardened implementations of such frequently performed functions in the programmable IC in order to conserve resources in the programmable fabric and reduce power, which enables more integration than is possible otherwise due to thermal or die size limitations.

SUMMARY

Techniques for providing programmable devices having hardened circuits are described. In an example, a programmable device includes: a configuration memory configured to store configuration data; a programmable logic having a configurable functionality based on the configuration data in the configuration memory; a signal conversion circuit; a digital processing circuit; an endpoint circuit coupled to the signal conversion circuit through the digital processing circuit; wherein the digital processing circuit includes a first one or more digital processing functions implemented as hardened circuits each having a predetermined functionality, and a second one or more processing functions implemented by the configurable functionality of the programmable logic.

In another example, a programmable device includes: a configuration subsystem; at least one programmable subsystem having a configurable functionality determined by the configuration subsystem; a signal conversion circuit; a digital processing circuit; an endpoint circuit coupled to the signal conversion circuit through the digital processing circuit; wherein the digital processing circuit includes at least one transform circuit or at least one digital front end (DFE) circuit each implemented as a hardened circuit having a predetermined functionality.

In another example, a programmable device, comprising: a configuration subsystem; at least one programmable subsystem having a configurable functionality determined by the configuration subsystem; a signal conversion circuit; a digital processing circuit; an endpoint circuit coupled to the signal conversion circuit through the digital processing circuit; wherein the digital processing circuit includes a first one or more digital processing functions implemented as hardened circuits each having a predetermined functionality, and a second one or more digital processing functions implemented by the configurable functionality of the at least one programmable subsystem.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
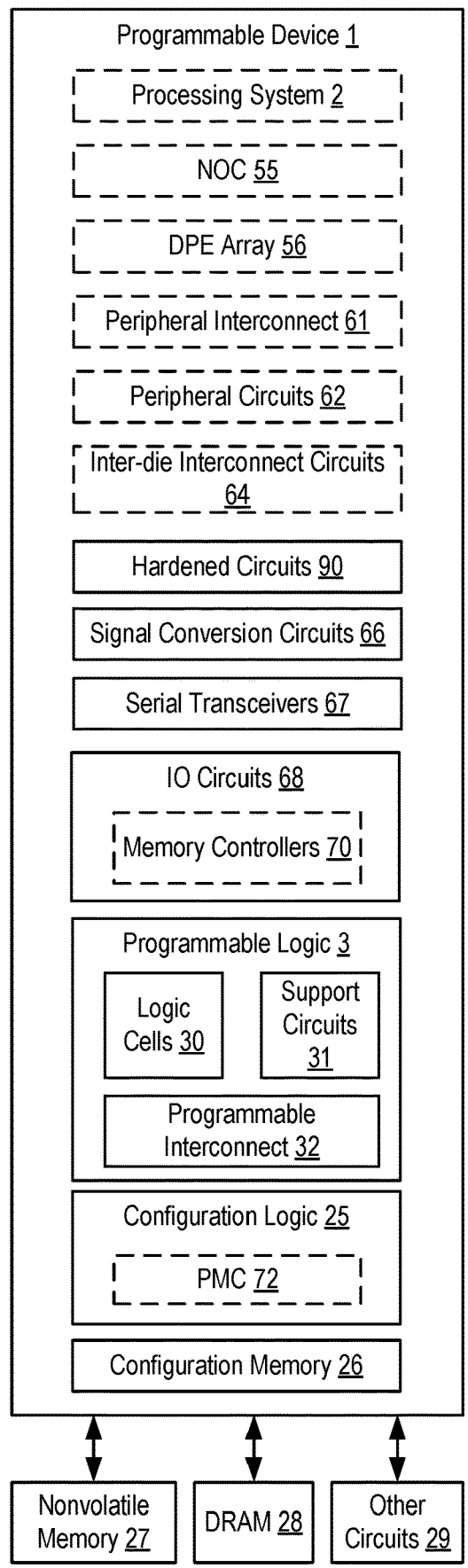
FIG. 1A is a block diagram depicting a programmable IC according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1A is a block diagram depicting a programmable device 1 according to an example. The programmable device 1 includes programmable logic (PL) 3 (also referred to as a programmable fabric), input/output (IO) circuits 68, serial transceivers 67, signal conversion circuits 66, hardened circuits 90, configuration logic 25, and configuration memory 26. The programmable device 1 can be coupled to external circuits, such as nonvolatile memory 27, dynamic random access memory (DRAM) 28, and other circuits 29. In various examples, the programmable device 1 further includes a processing system (PS) 2, a network-on-chip (NOC) 55, a data processing engine (DPE) array 56, peripheral interconnect 61, peripheral circuits 62, and inter-die interconnect circuits 64.

The PL 3 includes logic cells 30, support circuits 31, and programmable interconnect 32. The logic cells 30 include circuits that can be configured to implement general logic functions of a plurality of inputs. The support circuits 31 include dedicated circuits, such as digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the configuration logic 25 includes a platform management controller (PMC) 72. The PMC 72 is configured to boot and configure the subsystems of the programmable device 1, such as the PL 3, the PS 2, the NoC 55, the DPE array 56, the signal conversion circuits 66, the hardened circuits 90, and the like.

The IO circuits 68 provide an external interface for the subsystems of the programmable device 1, such as the PL 3, the PS 2, and the like. In some examples, the IO circuits 68 include memory controllers 70 configured to interface external memories (e.g., the DRAM 28). Other connectivity circuits can include the peripheral interconnect 61, the peripheral circuits 62, and the inter-die interconnect circuits 64. The peripheral interconnect 61 includes bus interface circuits, such as peripheral component interconnect express (PCIe) circuits and the like. The peripheral circuits 62 include universal serial bus (USB) ports, Ethernet ports, universal asynchronous transceiver (UART) ports, serial peripheral interface (SPI) ports, general purpose IO (GPIO) ports, serial advanced technology attachment (SATA) ports, and the like. The inter-die interconnect circuits 64 include circuits configured to interface like inter-die interconnect circuits in other programmable device(s) (e.g., for when the programmable device 1 is one die in a multi-die integrated circuit package). The serial transceivers 67 include high-speed transmit/receive circuits configured to provide an external IO interface for the programmable device 1.

The PS 2 can include microprocessor(s), memory, support circuits, IO circuits, and the like. The NOC 55 is configured to provide for communication between subsystems of the programmable device 1, such as between the PS 2, the PL 3, the hardened circuits 90, and the DPE array 56. The DPE array 56 can include an array of DPE's configured to perform data processing, such as an array of vector processors. The signal conversion circuits 66 include analog-to-digital converters (ADCs) and digital-to-analog converters (DACs).

The hardened circuits 90 comprise circuits with predetermined functionality. A given hardened circuit 90 can include one or more predetermined functions. Example hardened circuits 90 include filters, mixers, sample-rate converters, transforms circuits (e.g., Fast-Fourier Transform (FFT)), and the like. A hardened circuit 90 can be programmable to configure specific predetermined functionalities or select among predetermined functionalities. However, in contrast to a circuit in the PL 3, a hardened circuit 90 cannot be configured or reconfigured with different functionality. For example, a hardened circuit 90 can include a filter having two predetermined and selectable functionalities. A third functionality cannot be added to the hardened circuit 90, nor can one of the two functionalities be removed from the hardened circuit 90. In contrast, a filter configured in the PL 3 can be reconfigured to add one more additional functionalities or to remove one or more functionalities. Further, a filter configured in the PL 3 can be removed entirely and replaced with another circuit. In contrast, a hardened circuit 90 cannot be removed from the programmable device 1 (but can be unused if desired).

Figure 1B:
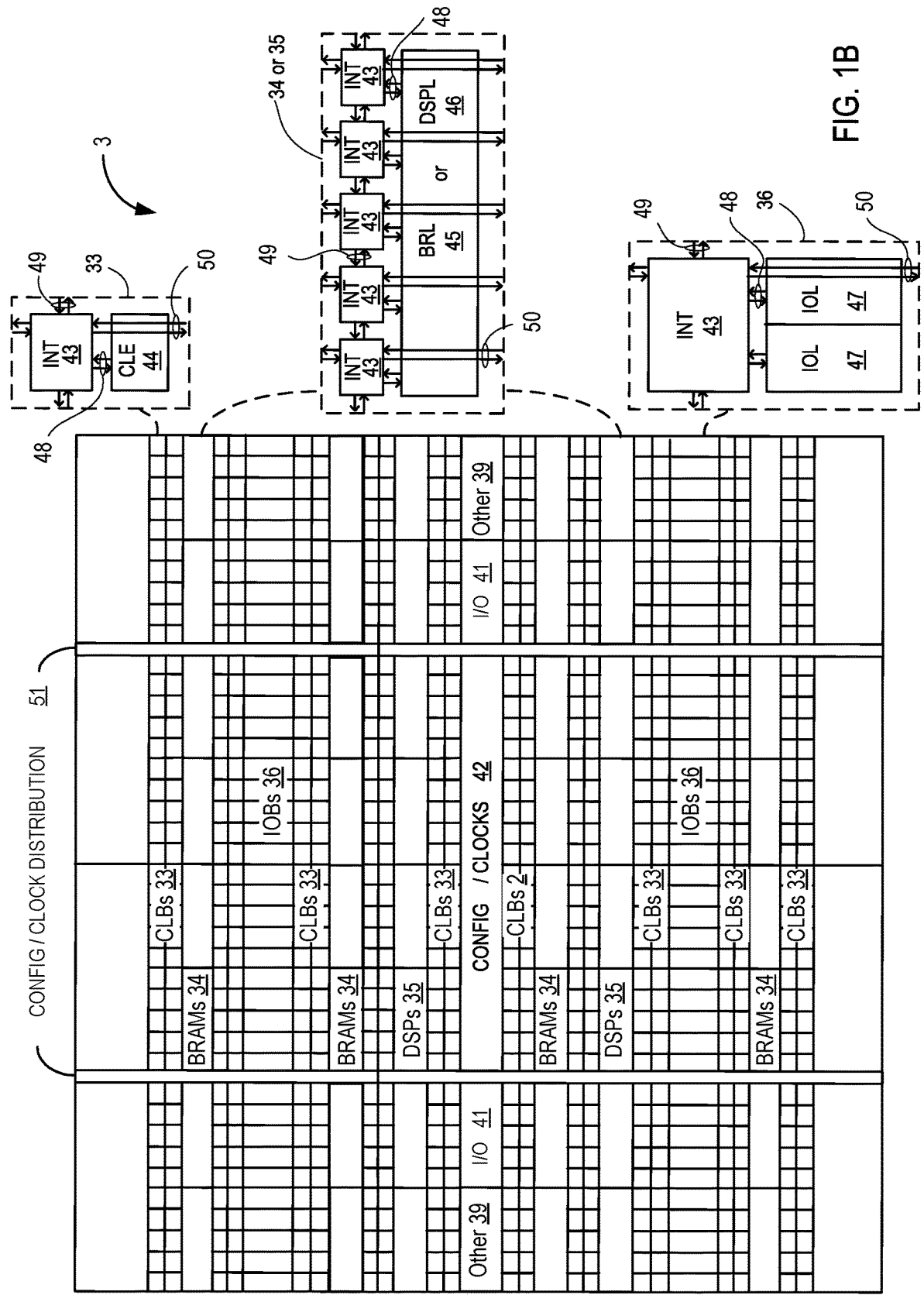
FIG. 1B illustrates a field programmable gate array (FPGA) implementation of a programmable IC according to an example.

FIG. 1B illustrates a field programmable gate array (FPGA) implementation of the PL 3 according to an example. The PL 3 shown in FIG. 1B can be used in any example of the programmable devices described herein. The PL 3 includes a large number of different programmable tiles including configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth.

In some PLs, each programmable tile can include at least one programmable interconnect element ("INT") 43 having connections to input and output terminals 48 of a programmable logic element within the same tile, as shown by examples included at the top of FIG. 1B. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 1B) is used for configuration, clock, and other control logic. Vertical columns 51 extending from this horizontal area or column are used to distribute the clocks and configuration signals across the breadth of the PL.

Some PLs utilizing the architecture illustrated in FIG. 1B include additional logic blocks that disrupt the regular columnar structure making up a large part of the PL. The additional logic blocks can be programmable blocks and/or dedicated logic.

Note that FIG. 1B is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 1B are purely exemplary. For example, in an actual PL more than one adjacent row of CLBs is typically included wherever the CLBs appear, to facilitate the efficient implementation of user logic, but the number of adjacent CLB rows varies with the overall size of the PL.

Figure 1C:
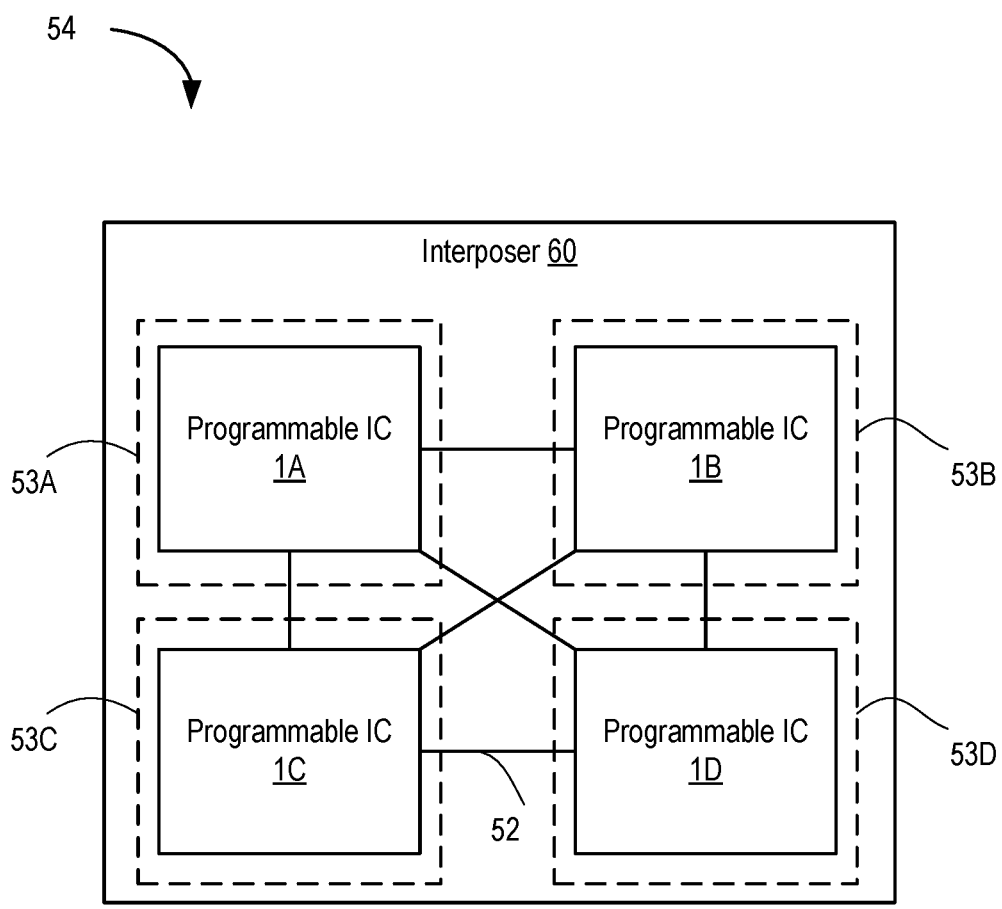
FIG. 1C is a block diagram depicting a multi-integrated circuit (IC) programmable device according to an example.

FIG. 1C is a block diagram depicting a multi-die programmable device 54 according to an example. The multi-die programmable device 54 includes a plurality of programmable devices 1, e.g., programmable devices 1A, 1B, 1C, and 1D. In an example, each programmable device 1 is an IC die disposed on an interposer 60. Each programmable device 1 comprises a super logic region (SLR) 53 of the programmable device 54, e.g., SLRs 53A, 53B, 53C, and 53D. The programmable devices 1 are interconnected through conductors on the interposer 60 (referred to as super long lines (SLLs) 52) and inter-die interconnect circuits 64 disposed within each of the programmable devices 1.

Figure 2:
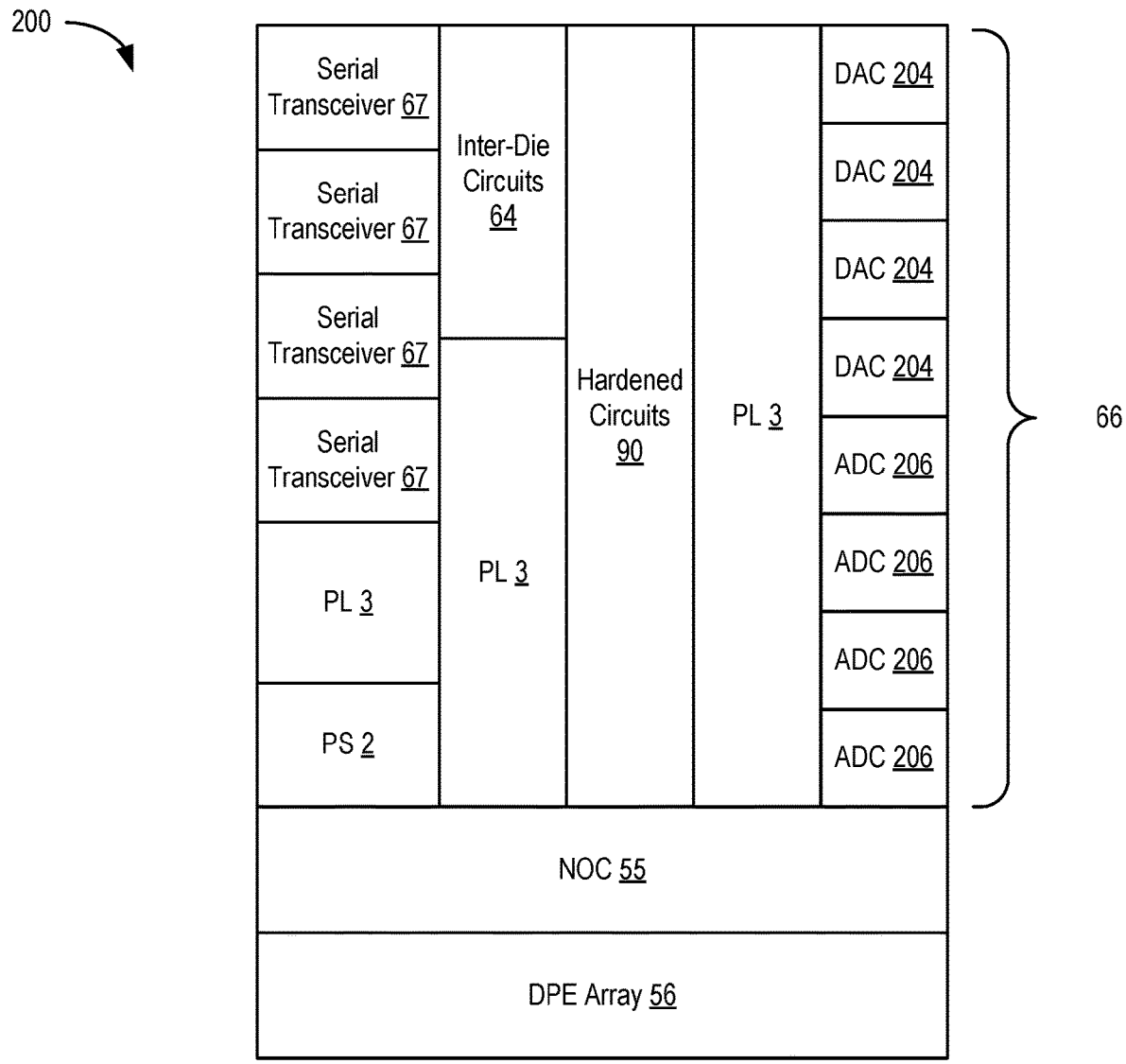
FIG. 2 is a block diagram depicting a floorplan of a programmable device according to an example.

FIG. 2 is a block diagram depicting a floorplan 200 of the programmable device 1 according to an example. In the example, the programmable device 1 includes columns of tiles that include the various circuits described above. For purposes of clarity by example, some circuits are omitted. In the example, the floorplan 200 shows columns of tiles having the PL 3. A column of tiles having DAC circuits 204. A column of tiles having ADC circuits 206. A column of tiles having inter-die interconnect circuits 64. A column of tiles having the hardened circuits 90. A column of tiles having the serial transceivers 67. The columnar tile structure can be interrupted by some subsystems, such as the PS 2, the NOC 55, and the DPE array 56.

In examples described herein, the hardened circuits 90 are used to implement digital processing circuits between the DACs 204/ADCs 206 and endpoint circuits, such as the serial transceivers 67 and/or circuits configured in the PL 3. To facilitate formation of the digital processing circuits, the hardened circuits 90 can be connected to the PL 3, the signal conversion circuits 66, the NOC 55, the inter-die circuits 54, and the transceivers 67. The connections can be implemented using the programmable interconnect in the PL 3, through the NOC 55, by direct connections, or some combination thereof. In some examples, the floorplan 200 includes a plurality of tiles, each of which may contain some or all of the hardened circuits 90. This allows for scalability based on the number of the ADC circuits 206 and DAC circuits 204.

In various applications, the programmable device 1 can be used to send and receive data received wirelessly using various radio frequency (RF) techniques. The ADCs 206 are configured to generate digital signals from analog signals received from external antennae (not shown). The resulting digital signals are then processed by some digital processing circuit and supplied to an endpoint circuit, which can be a circuit in the PL 3, transceivers 67, or some other subsystem. In reverse, the digital processing circuit can process digital signals to be transmitted from the endpoint circuits and supply the digital signals to the DACs 204. The DACs 204 generate analog signals from the digital signals, which are transmitted using the external antennae (not shown).

In some applications, the digital processing circuit used in the application described above can be formed in the PL 3. However, this requires the use of PL resources which are now otherwise unavailable for use by other circuitry. Accordingly, in some examples, a least a portion of the digital processing circuit is implemented using the hardened circuits 90. This frees PL resources for use by other circuitry in the system. However, since the hardened circuits 90 include connections to the PL 3, there is flexibility to implement some of the digital processing circuit in the PL 3. This allows a user to provide custom logic along with the hardened circuits 90 to implement the digital processing circuit as desired for the particular application. The custom logic may also be used to implement the control path of the digital processing circuit, which enhanced flexibility, while maintaining power efficiency as the data processing remains in the hardened domain.

Figure 3:
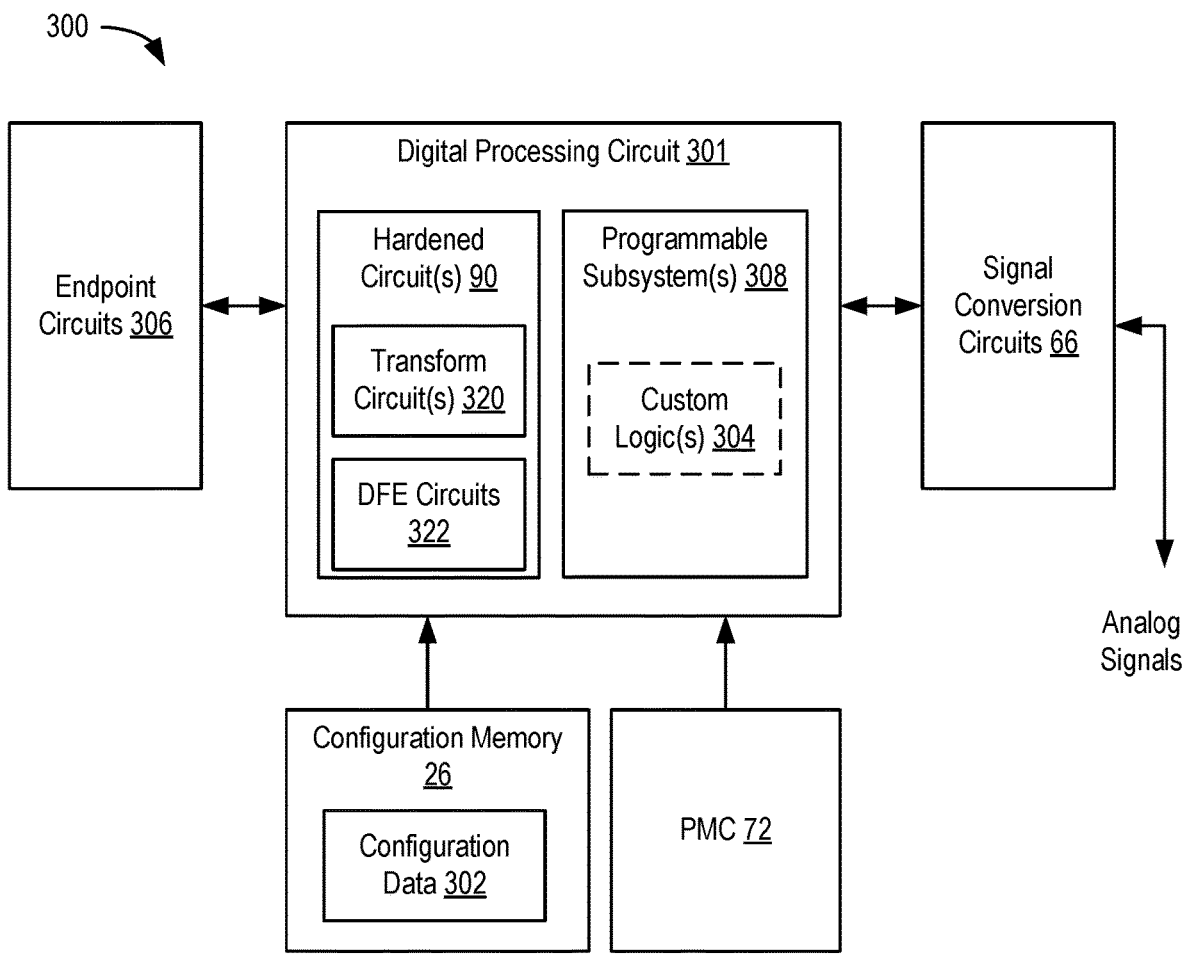
FIG. 3 is a block diagram depicting a signal processing system implemented in a programmable device according to an example.

FIG. 3 is a block diagram depicting a signal processing system 300 implemented in the programmable device 1 according to an example. The signal processing system 300 includes the signal conversion circuits 66, a digital processing circuit 301, and endpoint circuits 306. The signal conversion circuits 66 perform analog-to-digital and digital-to-analog conversion as described above. The digital processing circuit 301 is configured to process input for, and output of, the signal conversion circuits 66. In an example, the digital processing circuit 301 includes first digital processing functions implemented as hardened circuits 90 each having a predetermined functionality, and second digital processing functions implemented by the configurable functionality of the programmable subsystem(s) 308 (e.g., configurable functionality of the PL 3, the DPE array 56, and/or the PS 2). By implementing some digital processing functions as hardened circuits 90, the digital processing circuit 301 saves power and area in the programmable device. The type of digital processing functions that can be hardened include those that are common functions across various applications, or common functions used by various standards to which applications adhere (e.g., 4G/5G wireless communications). Examples include FFT/iFFT transforms, channel filtering, up and down sample rate conversion, crest factor reduction (CFR), and the like. The type of digital processing functions that can be programmed using configurable functionality of the programmable subsystem(s) 308 include those that are non-standard or unique to a particular application. For example, custom logics 304 can include digital predistortion (DPD) logic (e.g., a DPD circuit), calibration logic (e.g., a calibration circuit), beamforming, automatic gain control (AGC), timing and synchronization, and the like.

In an example, the digital processing circuit 301 includes a plurality of the hardened circuits 90. The hardened circuits 90 can include, for example, one or more transform circuits 320 (e.g., transform functions) and one or more digital front end (DFE) circuits 322 (e.g., DFE functions). The transform circuits 320 can include FFT, iFFT, and the like transform and inverse transform circuits. The DFE circuits 322 can include filters, sample rate converters, mixers, signal combiners, and the like.

In an example, the digital processing circuit 301 also includes one or more custom logics 304 programmed in at least one programmable subsystem 308 of the device. The programmable subsystems 308 can include, for example, the PL 3, the PS 2, the DPE array 56, and the like. For example, the custom logics 304 can include custom circuits configured in the PL 3. The custom logics 304 can include custom processors configured in the DPE array 56. The custom logics 304 can include a processor executing custom software in the PS 2. In examples, the custom logics 304 can include combinations of such implementations. The programmable subsystem(s) 308 are programmed based on a configuration subsystem comprising the configuration memory 26 and the PMC 72. The configuration memory 26 includes configuration data 302 for configuration custom circuits in the PL 3. The PMC 72 provides configuration data to the DPE array 56 and the PS 2, as well as the hardened circuits 90. The hardened circuits 90 and the custom logics 304 can be coupled in any of various serial, parallel, or like type arrangements.

Figure 4:
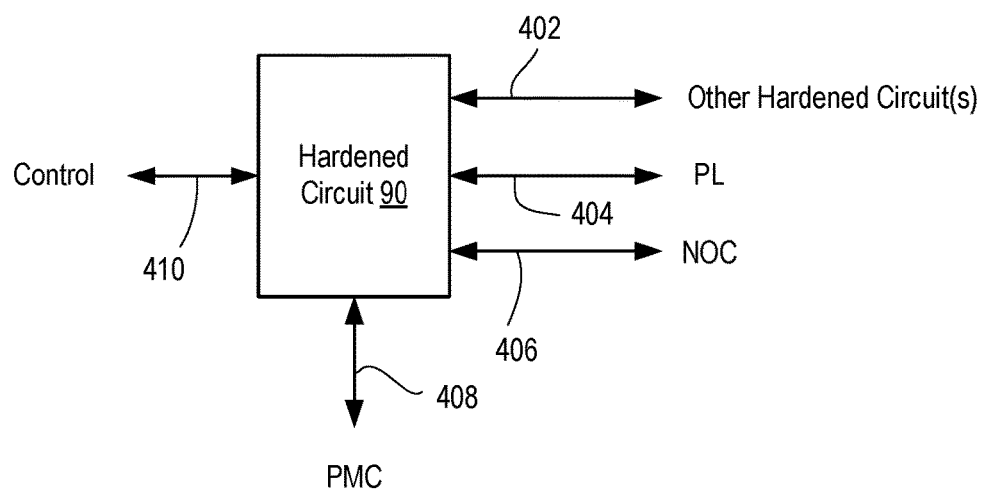
FIG. 4 is a block diagram depicting a hardened circuit according to an example.

FIG. 4 is a block diagram depicting a hardened circuit 90 according to an example. The hardened circuit 90 includes various interfaces, including an interface 402 to one or more other hardened circuits 90, an interface 404 to the PL 3, and an interface 406 to the NOC 55. Note that a given hardened circuit 90 can include all or a portion of the interfaces 402, 404 and 406. In some examples, the hardened circuit 90 includes an interface 408 to the PMC 72 for configuration thereof. The hardened circuit 90 can also include an interface 410 coupled to a specific control circuit (e.g., another hardened circuit 90 or a custom logic in a programmable subsystem). The control circuit can control operation of the hardened circuit 90 (e.g., the control circuit can be a state machine or like type circuit).

Figure 5:
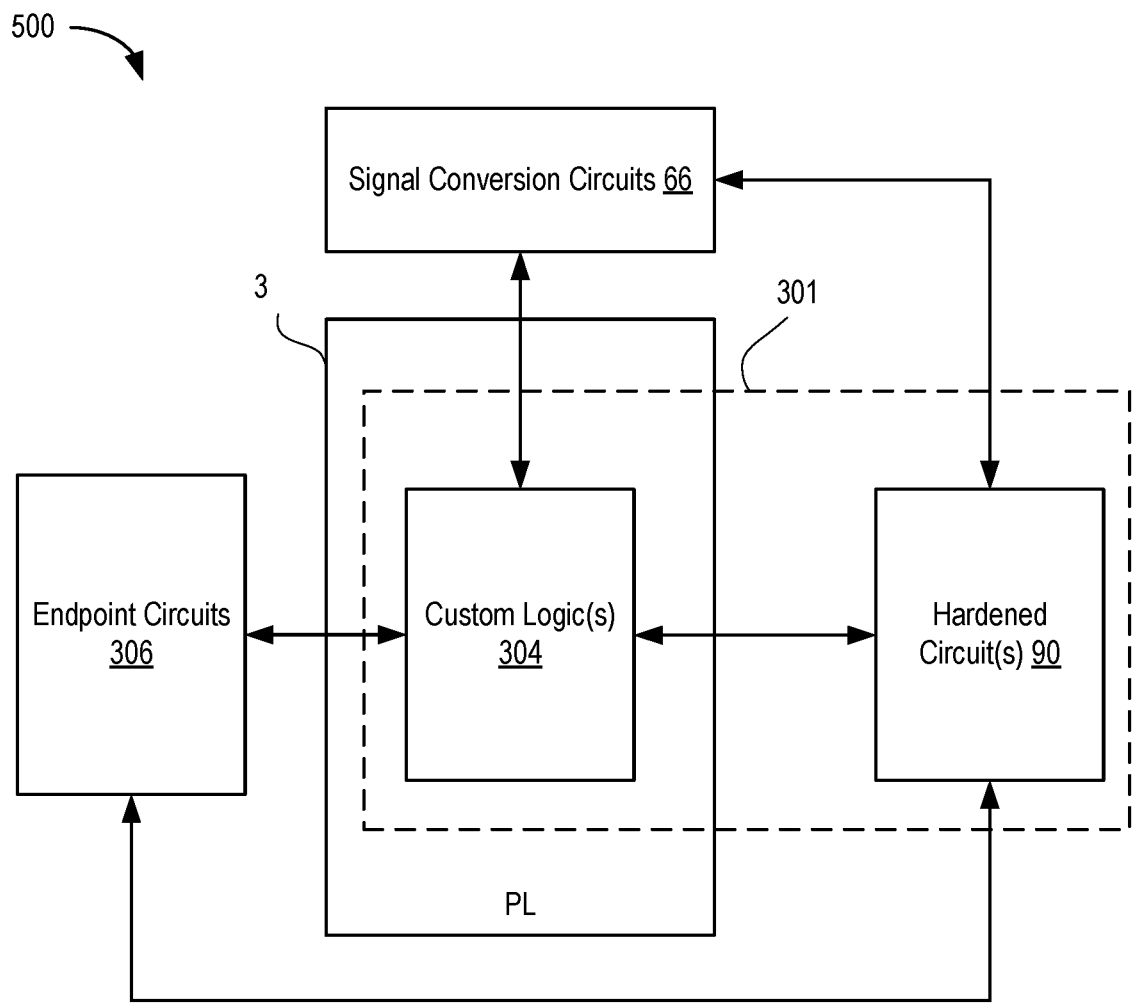
FIG. 5 is a block diagram depicting a signal processing system implemented in a programmable device according to an example.

FIG. 5 is a block diagram depicting a signal processing system 500 implemented in the programmable device 1 according to an example. The signal processing system 500 includes the signal conversion circuits 66, a plurality of hardened circuits 90, a plurality of custom circuits 304 configured in the PL 3, and endpoint circuit 306. The signal conversion circuits 66 perform analog-to-digital and digital-to-analog conversion as described above. The hardened circuits 90 each perform one or more functions, such as filtering, sample-rate conversion, mixing, carrier combining/splitting, time to frequency conversion, frequency to time conversion, and the like. The hardened circuits 90 each can include an interface to the PL 3. Configuration data 302 loaded to the configuration memory 26 configures the PL 3 with the custom circuits 304. Each custom circuit 304 can be connected to one or more of the hardened circuits 90. Each custom circuit 304 can be connected to one or more others of the custom circuits 304. One or more of the custom circuits 304 can be connected to the endpoint circuit 306. One or more of the custom circuits 304 can be coupled to the signal conversion circuits 66. One or more of the hardened circuits 90 can be coupled to the endpoint circuits 306.

The hardened circuits 90 and the custom circuits 304 form a digital processing circuit 301 disposed between the signal conversion circuits 66 and the endpoint circuit 306. While the endpoint circuit 306 is shown as external to the PL 3 (e.g., a serial transceiver), the endpoint circuit 306 can be configured in the PL 3.

In operation, the PMC 72 receives information for programming the programmable device 1. The PMC 72 loads configuration data for the PL 3 to the configuration memory 26. The PMC 72 also programs one or more of the hardened circuits 90 to initialize, select functionality, or the like. As noted above, each hardened circuit 90 has one or more predefined functions that cannot be changed. However, those function(s) can be programmable and the information for programming them can be received and provided by the PMC 72. In contrast to the hardened circuits 90, the PL 3 has a configurable functionality based on the configuration data 302 stored in the configuration memory 26. After programming and configuration, the programmable device 1 implements a digital processing circuit 301 between the signal conversion circuits 66 and the endpoint circuit 306 that includes the hardened circuits 90 and the custom circuits 304.

Figure 6:
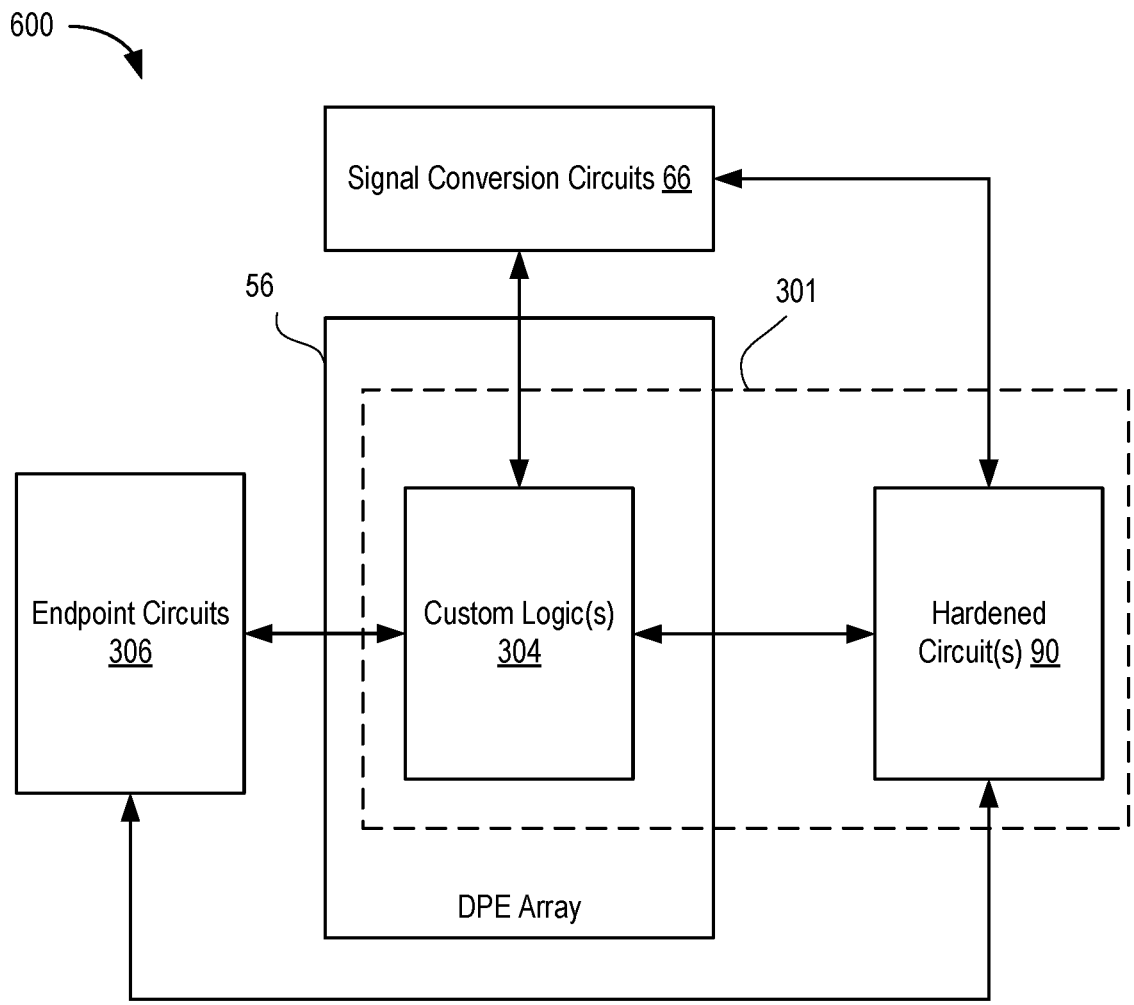
FIG. 6 is a block diagram depicting a signal processing system implemented in a programmable device according to an example.

FIG. 6 is a block diagram depicting a signal processing system 600 implemented in the programmable device 1 according to an example. The signal processing system 600 includes the signal conversion circuits 66, a plurality of hardened circuits 90, a plurality of custom logics 304 configured in the DPE array 56, and endpoint circuit 306. The signal conversion circuits 66 perform analog-to-digital and digital-to-analog conversion as described above. The hardened circuits 90 each perform one or more functions, such as filtering, sample-rate conversion, mixing, carrier combining/splitting, time to frequency conversion, frequency to time conversion, and the like. The hardened circuits 90 each can include an interface to the DPE array 56 (e.g., through the NOC 55). Each custom logic 304 can be connected to one or more of the hardened circuits 90. Each custom logic 304 can be connected to one or more others of the custom logics 304. One or more of the custom logics 304 can be connected to the endpoint circuit 306. One or more of the custom logics 304 can be coupled to the signal conversion circuits 66. One or more of the hardened circuits 90 can be coupled to the endpoint circuits 306.

The hardened circuits 90 and the custom circuits 304 form a digital processing circuit 301 disposed between the signal conversion circuits 66 and the endpoint circuit 306. While the endpoint circuit 306 is shown as external to the PL 3 (e.g., a serial transceiver), the endpoint circuit 306 can be configured in the PL 3.

In operation, the PMC 72 receives information for programming the programmable device 1. The PMC 72 loads configuration data for the DPE array 56. The PMC 72 also programs one or more of the hardened circuits 90 to initialize, select functionality, or the like. As noted above, each hardened circuit 90 has one or more predefined functions that cannot be changed. However, those function(s) can be programmable and the information for programming them can be received and provided by the PMC 72. In contrast to the hardened circuits 90, the DPE array 56 has a configurable functionality based on configuration data provided by the PMC 72. After programming and configuration, the programmable device 1 implements a digital processing circuit 301 between the signal conversion circuits 66 and the endpoint circuit 306 that includes the hardened circuits 90 and the custom logics 304.

Figure 7:
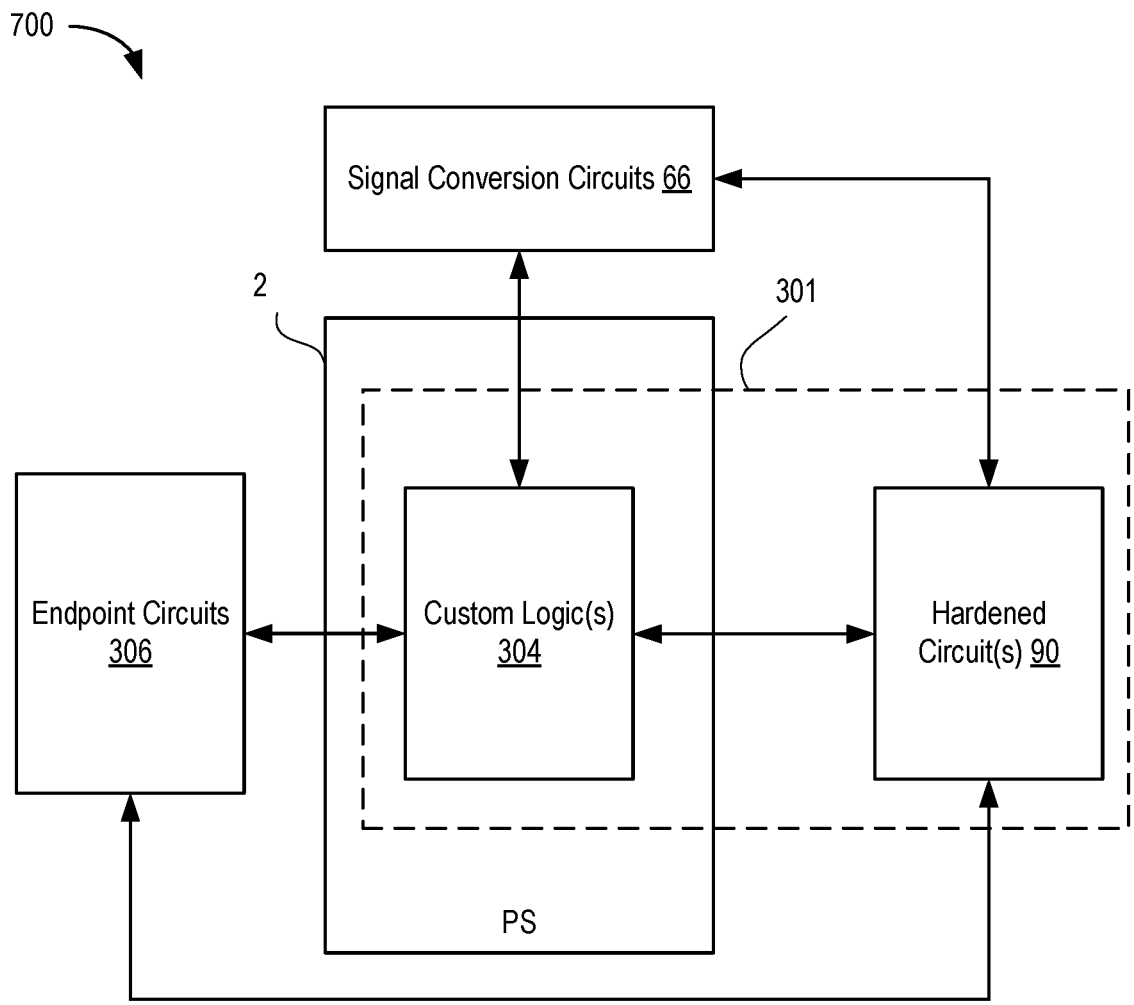
FIG. 7 is a block diagram depicting a signal processing system implemented in a programmable device according to an example.

FIG. 7 is a block diagram depicting a signal processing system 700 implemented in the programmable device 1 according to an example. The signal processing system 700 includes the signal conversion circuits 66, a plurality of hardened circuits 90, a plurality of custom logics 304 configured in the PS 2, and endpoint circuit 306. The signal conversion circuits 66 perform analog-to-digital and digital-to-analog conversion as described above. The hardened circuits 90 each perform one or more functions, such as filtering, sample-rate conversion, mixing, carrier combining/splitting, time to frequency conversion, frequency to time conversion, and the like. The hardened circuits 90 each can include an interface to the DPE array 56 (e.g., through the NOC 55). Each custom logic 304 is implemented by a processor executing software in the PS 2 and can be connected to one or more of the hardened circuits 90. Each custom logic 304 can be connected to one or more others of the custom logics 304. One or more of the custom logics 304 can be connected to the endpoint circuit 306. One or more of the custom logics 304 can be coupled to the signal conversion circuits 66. One or more of the hardened circuits 90 can be coupled to the endpoint circuits 306.

The hardened circuits 90 and the custom circuits 304 form a digital processing circuit 301 disposed between the signal conversion circuits 66 and the endpoint circuit 306. While the endpoint circuit 306 is shown as external to the PL 3 (e.g., a serial transceiver), the endpoint circuit 306 can be configured in the PL 3.

In operation, the PMC 72 receives information for programming the programmable device 1. The PMC 72 loads configuration data for the PS 2. The PMC 72 also programs one or more of the hardened circuits 90 to initialize, select functionality, or the like. As noted above, each hardened circuit 90 has one or more predefined functions that cannot be changed. However, those function(s) can be programmable and the information for programming them can be received and provided by the PMC 72. In contrast to the hardened circuits 90, the PS 2 has a configurable functionality based on configuration data provided by the PMC 72. After programming and configuration, the programmable device 1 implements a digital processing circuit 301 between the signal conversion circuits 66 and the endpoint circuit 306 that includes the hardened circuits 90 and the custom logics 304.

Figure 8:
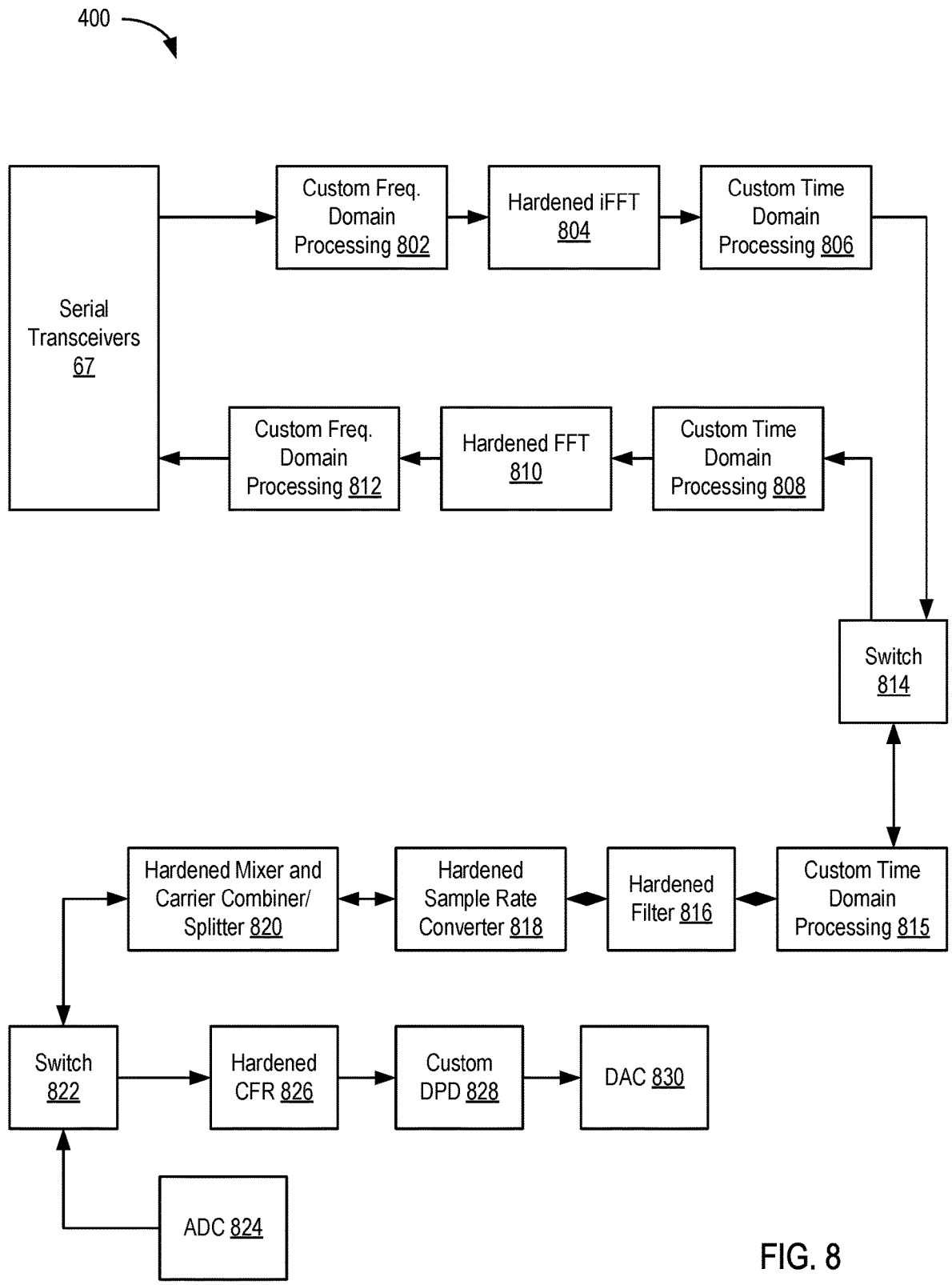
FIG. 8 is a block diagram depicting a signal processing system implemented in a programmable device according to an example.

FIG. 8 is a block diagram depicting a signal processing circuit 800 according to an example. The signal processing circuit 800 includes a mixture of custom circuits configured in the PL 3 and hardened circuits 90. Serial transceivers 67 are coupled to custom frequency domain processing 802 implemented in the PL 3. The custom frequency domain processing 802 performs some custom processing of frequency domain information to be transmitted. The custom frequency domain processing 802 is coupled to a hardened inverse Fast Fourier Transform (iFFT) circuit 804, which is implemented using one or more of the hardened circuits 90. The iFFT circuit 804 transforms the frequency domain information into time domain information. The iFFT circuit 804 is coupled to custom time domain processing 806 configured in the PL 3. The custom time domain processing 806 performs some custom processing of the time domain information to be transmitted.

In the reverse direction, the signal processing circuit 800 includes custom time domain processing 808, a hardened FFT 810, and custom frequency domain processing 812. The custom time domain processing 808 performs some processing of received time domain information and is implemented in the PL 3. The hardened FFT is implemented using one or more of the hardened circuits 90 and is configured to transform time domain information into frequency domain information. The custom frequency domain processing 812 is configured in the PL 3 and functions to process the frequency domain information. The frequency domain processing 812 is coupled to the serial transceivers 67.

The output of the custom time domain processing 806, and the input of the custom time domain processing 808, are coupled to a switch 814. The switch 814 can be implemented in the PL 3 or can be a hardened circuit implemented by one or more of the hardened circuits 90. The input/output of the switch 814 is coupled to custom time domain processing 815. The custom time domain processing 815 is configured in the PL 3 and performs some processing of the time domain information to be transmitted or that has been received. The custom time domain processing 815 is coupled to a hardened filter 816 implemented using one or more of the hardened circuits 90. The hardened filter 816 can have a programmable length and programmable coefficients. The hardened filter 816 can perform any type of filtering operation. The hardened filter 816 is coupled to a hardened sample rate converter 818 implemented using one or more hardened circuits 90. The hardened sample rate converter 818 functions to upsample or downsample the time domain information. The hardened sample rate converter 818 is coupled to a hardened mixer and carrier combiner/splitter 820 implemented using one or more of the hardened circuits 90. The hardened sample rate converter 818 can be programmable in the change in sample rate depending on signal bandwidth. The hardened mixer and carrier combiner/splitter 820 is configured to modulate/demodulate the time domain information, and to aggregate or split multiple streams of time domain signals, based on a particular modulation scheme (e.g., orthogonal frequency division multiplexing (OFDM)). The mixer and carrier combiner/splitter 820 is coupled to a switch 822. The switch 822 can be implemented in the PL 3 or can be a hardened circuit implemented by one or more of the hardened circuits 90.

An output of the switch 822 is coupled to a hardened crest factor reduction (CFR) circuit 826 implemented using one or more of the hardened circuits 90. An output of the CFR circuit 826 is coupled to a custom DPD circuit 828 implemented in the PL 3. An output of the DPD circuit 828 is coupled to a DAC 830. An input of the switch 822 is coupled to an output of an ADC 824. The ADC 824 and the DAC 830 are part of the signal conversion circuits 66.

The signal processing circuit 800 shown in FIG. 8 is one specific example of the alternating processing between hardened circuits 90 and custom circuits configured in the PL 3 performed by a specific digital processing circuit between signal conversion circuits and an endpoint circuit. Those skilled in the art will appreciate that other configurations are possible, including configurations that include all signal processing circuit blocks implemented using the hardened circuits 90.

While the foregoing is directed to specific examples, other and further examples may be devised without departing from the basic scope thereof, and the scope thereof is determined by the claims that follow.

What is claimed is:

1. A programmable device, comprising:
a signal conversion circuit;
a digital processing circuit; and
an endpoint circuit coupled to the signal conversion circuit through the digital processing circuit,
wherein the digital processing circuit comprises a hardened circuit configured to perform a first processing function using a predetermined functionality of the hardened circuit, and a programmable subsystem configured to perform a second processing function using a configurable functionality of the programmable subsystem.

2. The programmable device of claim 1, wherein the signal conversion circuit comprises at least one analog-to-digital conversion (ADC) circuit, at least one digital-to-analog conversion (DAC) circuit, or at least one ADC and at least one DAC.

3. The programmable device of claim 1, wherein the first processing function implemented as the hardened circuit includes a digital front end (DFE) function that comprises at least one of: a filter circuit, a sample-rate conversion circuit, and a mixer circuit or a transform function.

4. The programmable device of claim 1, wherein the first processing function implemented as the hardened circuit includes a transform function that comprises at least one of: a time-to-frequency domain transform circuit and a frequency-to-time domain transform circuit.

5. The programmable device of claim 1, wherein the second processing function implemented by the configurable functionality of the programmable subsystem includes at least one of a digital predistortion (DPD) circuit and a calibration circuit.

6. The programmable device of claim 1, wherein the programmable subsystem comprises programmable logic that includes columns of programmable tiles and a programmable interconnect, and wherein the hardened circuit is disposed in at least one column of hardened tiles adjacent to or interspersed within the columns of programmable tiles.

7. The programmable device of claim 1, wherein the first processing function includes one or more common functions across a plurality of applications, or one or more common functions used by one or more standards to which the plurality of applications adhere.

8. The programmable device of claim 1, wherein an input of the first processing function is coupled to an output of the endpoint circuit comprising a serial transceiver, and wherein an output of the first processing function is coupled to an input to the second processing function.

9. The programmable device of claim 1, further comprising:
a plurality of inter-die interface circuits,
wherein the hardened circuit in the digital processing circuit is coupled to the plurality of inter-die interface circuits.

10. A programmable device, comprising:
at least one programmable subsystem having a configurable functionality;
a signal conversion circuit;
hardened circuitry having a predetermined functionality; and
an endpoint circuit coupled to the signal conversion circuit through both the hardened circuitry and the at least one programmable subsystem.

11. The programmable device of claim 10, wherein the signal conversion circuit comprises at least one analog-to-digital conversion (ADC) circuit, at least one digital-to-analog conversion (DAC) circuit, or at least one ADC and at least one DAC.

12. The programmable device of claim 10, wherein the at least one programmable subsystem comprises at least one of: a programmable logic, an array of data processing engines (DPEs), and a processing system.

13. The programmable device of claim 10, wherein the hardened circuitry includes one or more common functions across a plurality of applications, or one or more common functions used by one or more standards to which the plurality of applications adhere.

14. The programmable device of claim 10, wherein the hardened circuitry comprises at least one of: a filter circuit, a sample-rate conversion circuit, and a mixer circuit.

15. The programmable device of claim 10, wherein the hardened circuitry comprises at least one of: a time-to-frequency domain transform circuit and a frequency-to-time domain transform circuit.

16. A programmable device, comprising:
a signal conversion circuit;
a digital processing circuit; and
an endpoint circuit coupled to the signal conversion circuit through the digital processing circuit,
wherein the digital processing circuit includes a first digital processing function implemented as a hardened circuit having a predetermined functionality, and a second digital processing function implemented by a configurable functionality of a programmable subsystem.

17. The programmable device of claim 16, wherein the programmable subsystem comprises at least one of: a programmable logic, an array of data processing engines (DPEs), and a processing system.

18. The programmable device of claim 16, wherein the first digital processing function implemented as the hardened circuit includes a digital front end (DFE) function or a transform function.

19. The programmable device of claim 16, wherein the first digital processing function includes one or more common functions across a plurality of applications, or one or more common functions used by one or more standards to which the plurality of applications adhere.

20. The programmable device of claim 19, wherein the second digital processing function includes one or more functions that are unique among the plurality of applications, or one or more functions that are non-compliant with the one or more standards.

* * * * *

UNITED STATES PATENT AND TRADEMARK OFFICE
CERTIFICATE OF CORRECTION

PATENT NO. : 11,196,423 B1
APPLICATION NO. : 16/911361
DATED : December 7, 2021
INVENTOR(S) : John Edward McGrath et al.

Page 1 of 1

It is certified that error appears in the above-identified patent and that said Letters Patent is hereby corrected as shown below:

In the Specification

Column 1, Line 29, Delete "tiles," and insert -- tiles. --, therefor.

Column 1, Line 33, Delete "dock" and insert -- clock --, therefor.

Column 1, Line 35, Delete "the" and insert -- tile --, therefor.

In the Claims

Column 12, Line 11, Claim 10, delete "the at" and insert -- at --, therefor.

Signed and Sealed this
Twenty-first Day of June, 2022

Katherine Kelly Vidal
*Director of the United States Patent and Trademark Office*